United States Patent [19]
Tokui et al.

[11] Patent Number: 5,384,218
[45] Date of Patent: Jan. 24, 1995

[54] PHOTOMASK AND PATTERN TRANSFER METHOD FOR TRANSFERRING A PATTERN ONTO A SUBSTRATE HAVING DIFFERENT LEVELS

[75] Inventors: Akira Tokui; Maria O. DeBeeck, both of Itami, Japan

[73] Assignee: Mitsubishi Denki Kabushiki Kaisha, Tokyo, Japan

[21] Appl. No.: 37,389

[22] Filed: Mar. 26, 1993

[30] Foreign Application Priority Data

Mar. 31, 1992 [JP] Japan .................................. 4-074983

[51] Int. Cl.⁶ .............................................. G03F 9/00
[52] U.S. Cl. ........................................ 430/5; 430/323; 430/326; 430/328
[58] Field of Search .................. 430/5, 321, 323, 326, 430/328

[56] References Cited

U.S. PATENT DOCUMENTS 4,806,442  2/1989  Shirasaki et al. ........................ 430/4

FOREIGN PATENT DOCUMENTS 63-131143  6/1988  Japan .
1147458   6/1989  Japan .

Primary Examiner—Steve Rosasco
Attorney, Agent, or Firm—Leydig, Voit & Mayer

[57] ABSTRACT

A photomask for projecting a transfer pattern onto a wafer having a plurality of regions with different surface levels includes a transparent substrate; a shielding member on the transparent substrate having a plurality of patterns for projection onto respective regions of the wafer; and an optical-path-length varying layer on at least one of the patterns corresponding to a region of the wafer other than a reference region of the wafer for changing the optical path length of light transmitted through the pattern by a length corresponding to the difference in surface level between the corresponding region and the reference region of the wafer. A pattern transfer method using such a photomask includes directing light onto the photomask; effecting a change in the position of the apparent object-side image surface for at least one pattern including the optical-path-length varying layer; and simultaneously forming on surfaces of the wafer regions image formation planes respectively corresponding to at least two patterns by image projection using light transmitted through the patterns.

5 Claims, 7 Drawing Sheets

PHOTOMASK AND PATTERN TRANSFER METHOD FOR TRANSFERRING A PATTERN ONTO A SUBSTRATE HAVING DIFFERENT LEVELS

BACKGROUND OF THE INVENTION

1. Field of the Invention

This invention relates to a photomask and a pattern transfer method and, in particular, to a photomask and a pattern transfer method for transferring, in a reduction projection exposure process, a minute pattern onto a wafer having a non-planar surface.

2. Description of the related art

Generally speaking, in a reduction projection exposure process, which is conducted to produce semiconductor devices etc., a photomask is used. The photomask includes a desired transfer pattern consisting of light transmissive and light shielding portions that are respectively transparent and opaque with respect to an illuminating light. FIG. 5 is a sectional view of a conventional photomask 1 of this type. The photomask 1 has a transparent substrate 2 in the form of a flat plate made of quartz or the like, and a metal layer 3 thereon in a desired pattern. Those portions where the metal layer 3 is present on the substrate 2 constitute the light shielding portions, and those portions consisting only of the transparent substrate 2 constitute the transmissive portions which transmit the illuminating light.

A pattern transfer method using this photomask 1 will be described with reference to FIG. 6. The illuminating light from a light source 4 is transmitted through a condenser lens 5 to illuminate the entire surface of the photomask 1. The illuminating light transmitted through the transmissive portions of the photomask 1 projects an image of the transfer pattern of the photomask 1 onto the surface of a wafer 7 through a projection lens system 6. A photoresist 9, serving as a photosensitive material, previously applied to the surface of a substrate 8 of the wafer 7 receives the image of the pattern of the photomask 1 on a surface 9a. By developing the photoresist 9, the pattern transfer is effected.

Assuming that the aberration in the projection lens system 6 is so small as to be negligible, the image formed on the surface 9a of the photoresist 9 of the wafer 7 by the illuminating light from the flat photomask 1 is planar. The image formation characteristics of the formed image are maintained within a range of a predetermined depth of focus D with respect to the direction of the optical axis of the illuminating light. That is, as shown in FIG. 6, satisfactory image formation characteristics can be obtained within the range between planes S1 between which the surface 9a of the photoresist 9 is located.

However, when semiconductor devices are produced, a large number of layers having various patterns are formed on a wafer substrate during circuit formation. As a result, in the reduction projection exposure process, the surface of the photoresist, onto which the pattern of the photomask is to be printed, cannot always be a uniform, flat surface but may be a non planar surface. For example, as shown in FIG. 7, the formation of an insulating layer 20 on a substrate 18 of a wafer 17 may result in a step difference A having a height H, between first and second ranges R1 and R2 having different surface levels.

When the height H of this difference A is within the range of the depth of focus D of the illuminating exposure apparatus, it is possible to obtain satisfactory image formation characteristics in both the first and second ranges R1 and R2 of the wafer 17. When, however, the difference A is in excess of the range of the depth of focus D, defocusing occurs in at least one of the ranges R1 and R2, resulting in a deterioration in the accuracy of the pattern transfer.

The depth of focus D varies in different illuminating exposure apparatus. A difference A having a height of 1 μm or more is often incapable of being kept within the range of the depth of focus D, resulting in a deterioration in transfer accuracy.

A photomask for transferring a minute pattern onto a wafer having such a non-planar surface has been proposed in Japanese Patent publication 1-147458, and is shown in FIG. 8. As shown in the drawing, in the peripheral portions of first openings 11, which constitute the pattern to be transferred, are second, small openings 12 for generating a phase difference. Further, phase shift layers 13 are provided in the second openings 12. A light 15 coming from a light source and impinging upon the second openings 12 is changed in phase as it is transmitted through the phase shift layers 13 to interfere with a light 14 transmitted through the first openings 11. Due to this arrangement, an improvement is attained in the degree of process tolerances. However, this involves a change in the best focus position, depending upon the difference in phase between the light beams 14 and 15. In view of this, the phase shift layers 13, in the second openings 12, are designed to produce a phase difference corresponding to the height of the wafer onto which an image of the openings 11 is to be projected. By using this photomask, it is possible to transfer a minute pattern onto the entire area of a wafer having a difference in surface level of approximately ±1 μm.

A problem with this photomask is that the second, minute openings 12 for phase difference generation have to be located in the peripheral portions of the first openings 11 to be transferred, with the result that the pattern formed on the photomask is very complicated. Further, the difference in phase, which has an influence on the best focus position within the range of 0° to 360°, remains the same even in the range beyond 360° because of its cyclical nature. Thus, although this photomask utilizing phase difference, disclosed in the above publication, is effective with respect to a wafer having a difference in surface level of approximately ±1 μm or less, it is difficult for the photomask to attain the best focus over the entire area with respect to a wafer having a larger difference in surface level.

SUMMARY OF THE INVENTION

This invention has been made with a view toward eliminating the above problems in the prior art. It is an object of this invention to provide a photomask and a pattern transfer method which allow a minute pattern to be transferred to a wafer with high accuracy over the entire area of the wafer even when the wafer has a difference in surface level that is larger than the depth of focus.

In accordance with the present invention, there is provided a photomask for projecting a transfer pattern onto a wafer having a plurality of regions with different surface levels, the photomask comprising: a transparent substrate; a shielding member provided on the transparent substrate and having a plurality of opening patterns respectively projected onto the plurality of regions of the wafer; and an optical-path-length varying layer formed on each of the opening patterns corresponding to those regions of the wafer which are other than a reference region to impart to light transmitted through this opening pattern an optical path length corresponding to the difference in surface level between the corresponding region of the wafer and the reference region, thereby forming an image formation plane of each opening pattern on the surface of the corresponding region of the wafer.

In accordance with the present invention, there is further provided a method of transferring a pattern onto a wafer having a plurality of regions with different surface levels, the method comprising the steps of: illuminating a photomask having a plurality of opening patterns to be respectively transferred to plurality of regions of a wafer; imparting to the light transmitted through each of those opening patterns of the photomask corresponding to those regions of the wafer other than a reference region an optical path length corresponding to the difference in surface level between the corresponding region of the wafer and the reference region, thereby effecting a change in the position of the apparent object-side image surface for each opening pattern of the photomask; and projecting an image of each of the opening patterns respectively onto the corresponding regions of the wafer using the light transmitted through the plurality of opening patterns of the photomask, thereby simultaneously forming on the plurality of regions of the wafer image-formation planes which respectively correspond to these regions.

DESCRIPTION OF THE PREFERRED EMBODIMENTS

An embodiment of the present invention will now be described with reference to the accompanying drawings.

Figure 1:
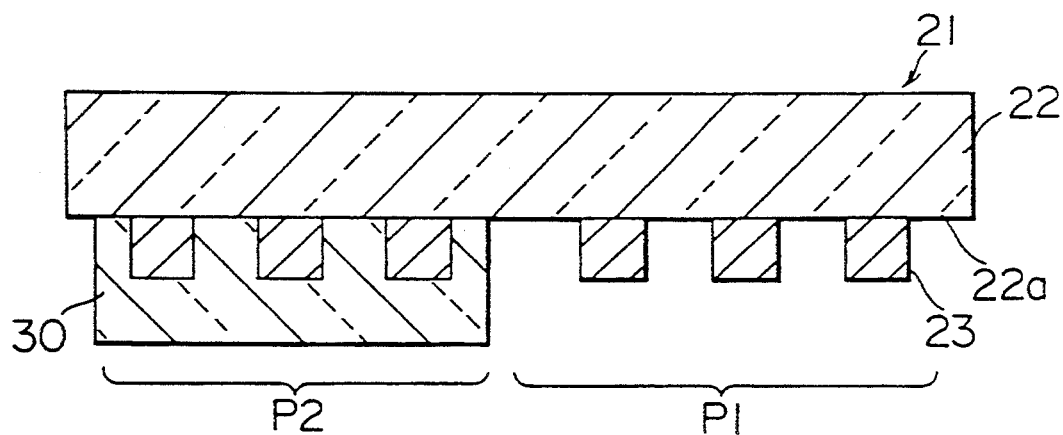
FIG. 1 is a sectional view of a photomask according to an embodiment of this invention.
Figure 7:
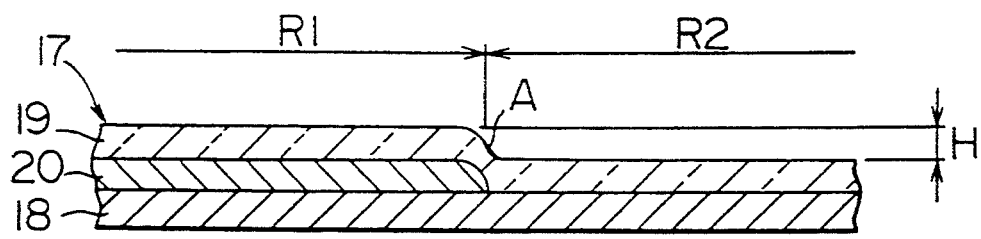
FIG. 7 is a sectional view showing a wafer having a non-planar surface.
Figure 8:
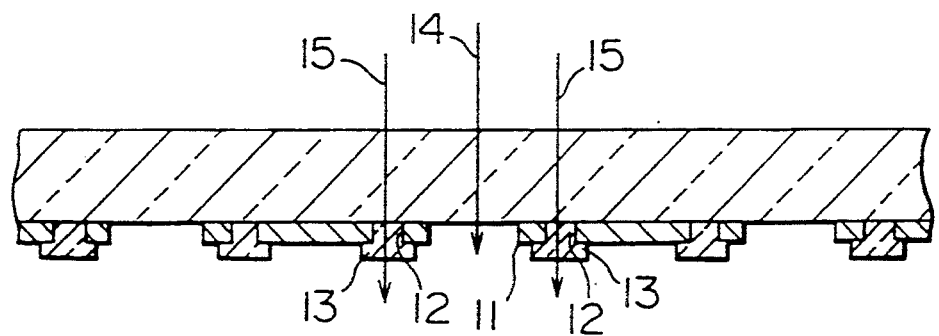
FIG. 8 is a sectional view showing another conventional photomask.

Referring to FIG. 1, a photomask 21 according to an embodiment of this invention includes a plate-like transparent substrate 22 consisting of quartz or the like and a metal film 23 serving as a shielding member which is formed into a desired pattern on a surface 22a of the transparent substrate 22. The photomask 21 is used in pattern transfer, for example, to the wafer 17 shown in FIG. 7, which has first and second regions R1 and R2 having different surface levels. As shown in FIG. 1, the metal film 23 is formed into first and second patterns P1 and P2 which are to be transferred onto the first and second regions R1 and R2, respectively, of the wafer 17. Further, an optical-path-length varying layer 30 is disposed on the surface 22a of the transparent substrate 22 in the second pattern P2. The optical-path-length varying layer 30 is a material transparent to the illuminating light used in pattern transfer and varies, in a predetermined amount, the optical path length of the light transmitted through the second pattern P2.

Figure 2:
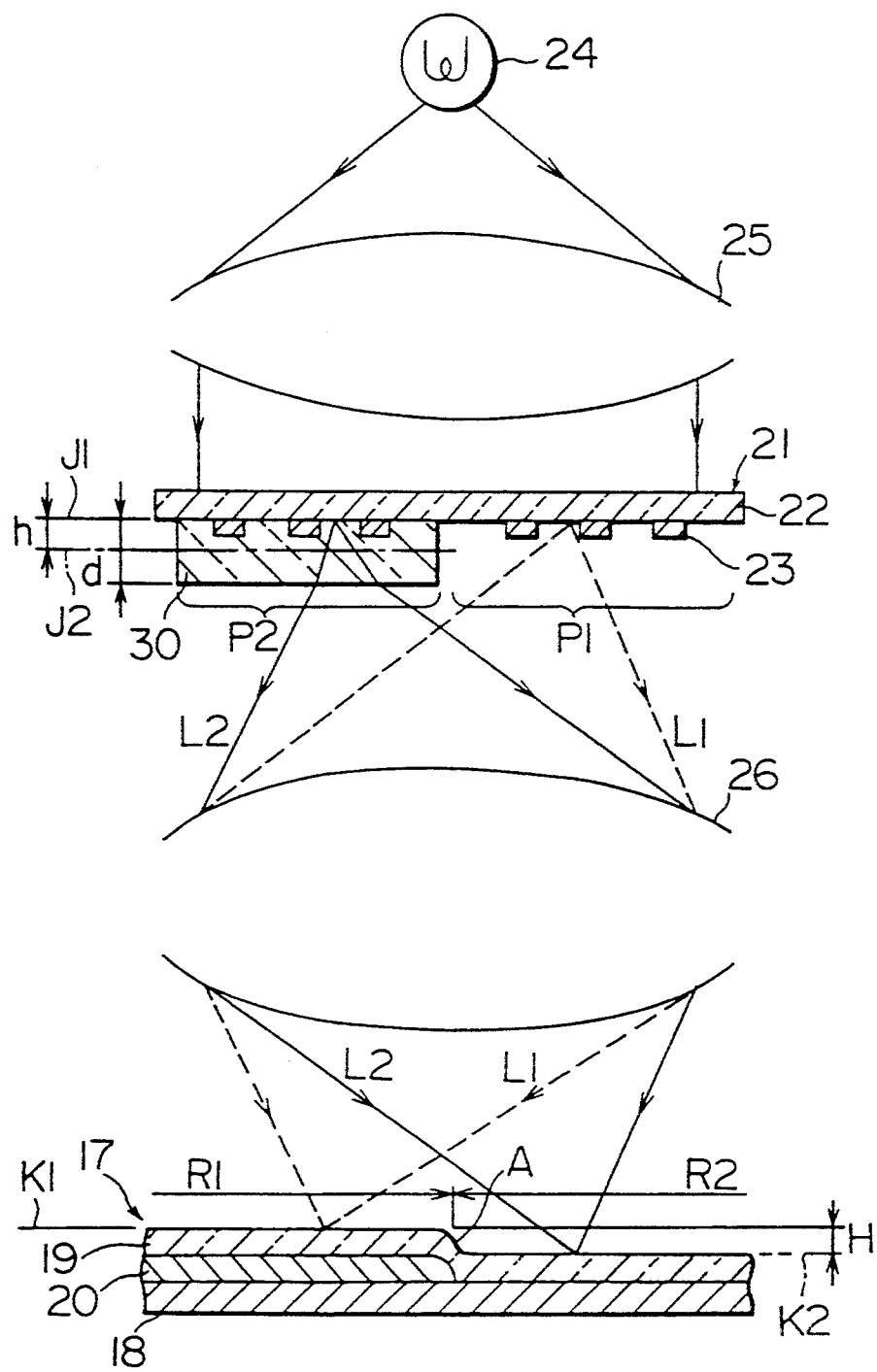
FIG. 2 is a diagram illustrating a method of pattern transfer by using the photomask shown in FIG. 1.

A method of pattern transfer using the photomask 21 will be described with reference to FIG. 2. The photomask 21 is arranged below a light source 24, such as a mercury lamp, with a condenser lens system 25 therebetween. Arranged below the photomask 21, on the opposite side of a projection lens system 26, is the wafer 17, which has the photoresist 19 on the substrate 18. Due to the insulating layer 20 on a part of the substrate, the surface of the photoresist 19 a surface level difference A, resulting in the formation of the first and second regions R1 and R2 having different surface levels.

The light from the light source 24 illuminates the entire surface of the photomask 21 through the condensing lens system 25. Light rays L1 transmitted through the first pattern P1 of the photomask 21 reach the wafer 17 by way of the projection lens system 26, projecting an image of the first pattern P1 onto the surface of the first region R1. That is, regarding the first pattern P1, an object-side image surface J1 is formed by the surface 22a of the transparent substrate 22, and an optimum image formation plane K1 is formed on the surface of the first region R1 of the wafer 17.

Light rays L2 transmitted through the second opening pattern P2 of the photomask 21 first pass through the optical-path-length varying layer 30. In this process, the optical path length of the light rays L2 is changed by a predetermined amount in correspondence with the thickness d of the optical-path-length varying layer 30. As a result, an apparent object-side image surface J2 is formed at a position spaced away by a distance h from the object-side image surface J1 with respect to the first pattern P1. The light rays L2, thus transmitted through the optical-path-length varying layer 30, reach the wafer 17 through the projection-lens system 26, projecting an image of the second pattern P2 onto the wafer. However, due to the fact that the position of the apparent object-side image surface J2 is spaced by the distance h from the object-side image surface J1 regarding the first pattern P1, an optimum image-formation plane K2 based on the light rays L2 is formed at a position different from that of the optimum image formation plane K1 based on the light rays L1.

Thus, by previously setting the thickness d of the optical-path-length varying layer 30 in such a way that the the optimum image formation plane K2 based on the light rays L2 is formed at a position spaced from the optimum image formation plane K1 based on the first light rays L2 by a distance corresponding to the difference in height H between the first and second regions R1 and R2 of the wafer 17, the optimum image formation plane K2 of the second opening pattern P2 is formed on the surface of the second region R2 of the wafer 17.

In this way, it is possible to expose the surfaces of the first and second regions R1 and R2 of the wafer 17 having the surface level difference A by simultaneously forming the respective optimum image formation planes K1 and K2 of the first and second patterns P1 and P2 of the photomask 21. After that, the photoresist 19 is developed, thereby transferring the first and second patterns P1 and P2.

It is desirable that the optical-path-length varying layer 30 possess a high transmittance of, for example, 95% or more, with respect to the light rays L2 transmitted therethrough. Examples of the material for the layer include oxides, such as $SiO_2$ or aluminum oxides, nitrides, such as SiN, and organic polymers, such as F-type resins. It is also possible to arbitrarily combine and laminate such oxides, nitrides and organic polymers and use the laminated material as the optical-path-length varying layer 30.

Figure 3:
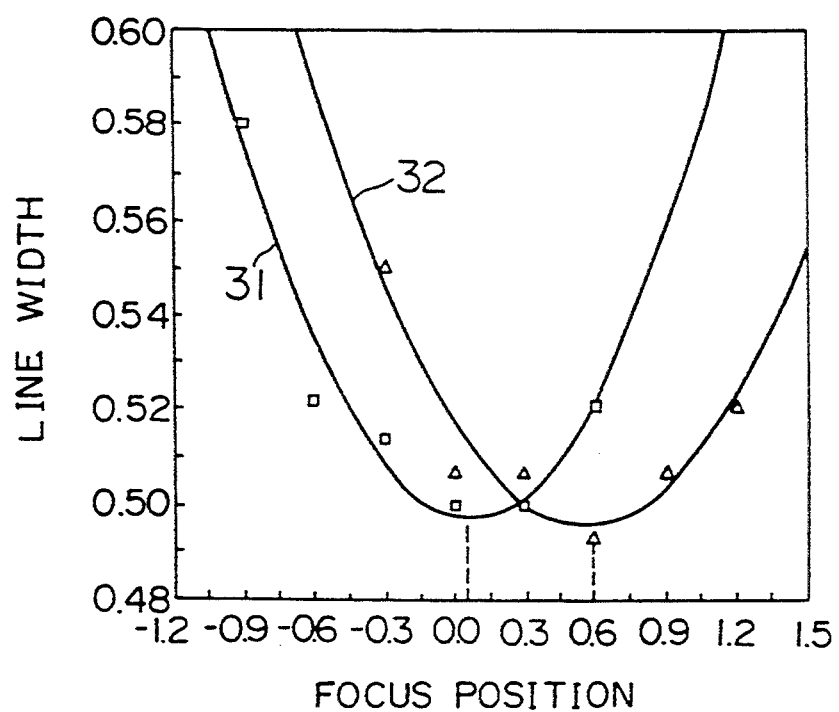
FIG. 3 is a diagram showing a difference in the position of the optimum image-formation plane where an optical-path-length varying layer is provided in an opening and where no such layer is provided.

By way of experiment, a pattern having a predetermined width was formed on a photomask for the purpose of measuring the difference in position of the optimum image formation plane between the case where an optical-path-length varying layer was provided on the pattern and the case where no such layer was provided. The results of the measurement are shown in FIG. 3. The material used for the optical-path-length varying layer was an F-type resin having a thickness d of 70 μm. In FIG. 3, the horizontal axis indicates the focus position, and the vertical axis indicates the line width of the photoresist. Curve 31 represents the case where no optical-path-varying layer was provided, and curve 32 represents the case where an optical-path-length varying layer was provided. It can be seen from the drawing that the provision of an optical-path-length varying layer resulted in the position of the optimum image formation plane being varied by approximately 0.6 μm.

The larger the thickness d of the optical-path-length varying layer, the greater becomes the variation in the optical path length of the light transmitted through the optical-path-length varying layer, with the position of the optimum image formation plane being shifted accordingly. Thus, even with a wafer having a surface level difference with a height of 1 μm or more, the optimum image formation planes can be easily formed on the surfaces of the regions of the different levels by augmenting the thickness of the optical-path-length varying layer. Further, even if the thickness of the optical-path-length varying layer is kept constant, the variation in optical path length can be augmented by forming the optical-path-length varying layer from a material having a higher index of refraction, thereby making it possible to greatly shift the position of the optimum image formation plane.

When transferring a continuous opening pattern extending across the step section forming the surface level difference A simultaneously onto the first and second regions R1 and R2 of the wafer 17, it is desirable that the phase difference between the light rays L1 and L2, which are projected onto the first and second regions R1 and R2, respectively, be set to zero. In this arrangement, it is possible to reduce the variation in light intensity due to interference around the step section of the wafer surface level difference A, where the two light rays L1 and L2 overlap each other. Thus, it is possible to effect high-accuracy transfer of a pattern extending across the step section forming the surface level difference A. To reduce the phase difference between the light rays L1 and L2 to zero, it is only necessary for the following condition to be satisfied: $(n-1)d = \lambda(2m+1)$, where $\lambda$ is the wavelength of the light; n is the refractive index and d is the thickness of the optical-path-length varying layer 30 at the wavelength $\lambda$, and m represents an integer.

Figure 4:
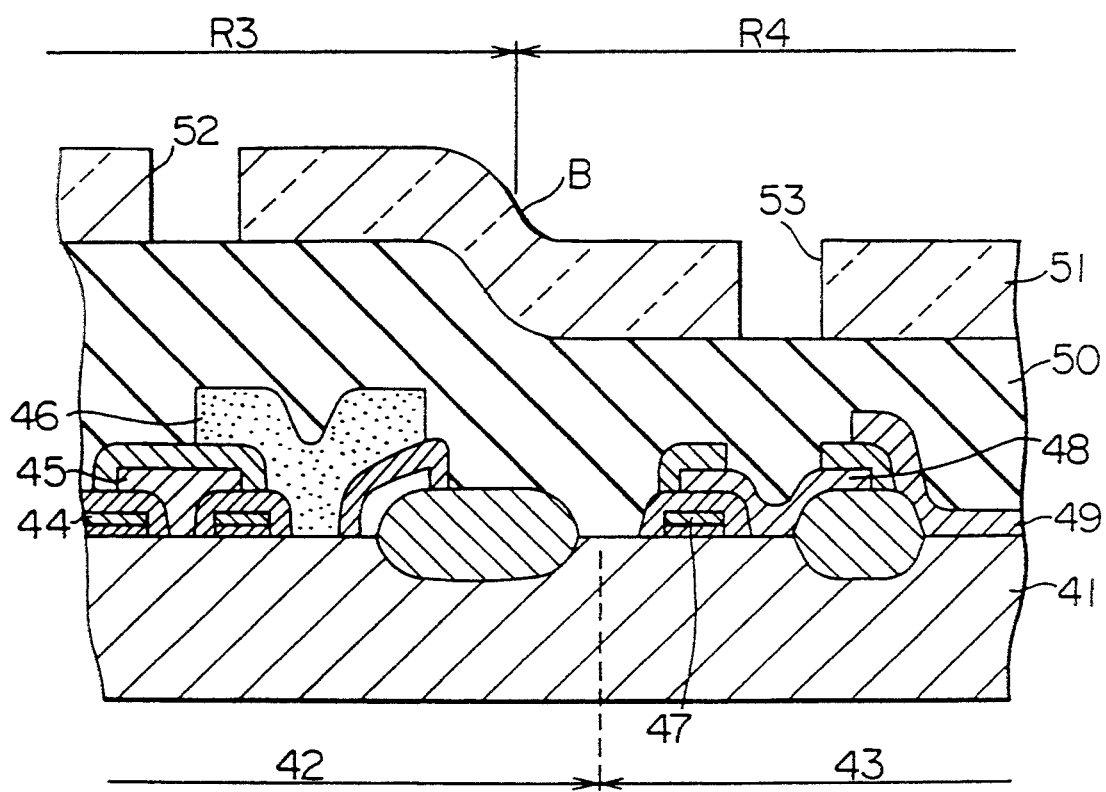
FIG. 4 is a sectional view showing an example of a wafer with a non planar surface onto which a pattern can be transferred utilizing the present invention.
Figure 5:
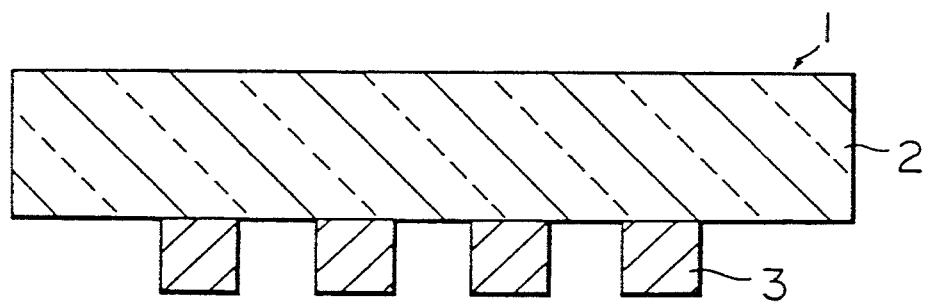
FIG. 5 is a sectional view showing a conventional photomask.
Figure 6:
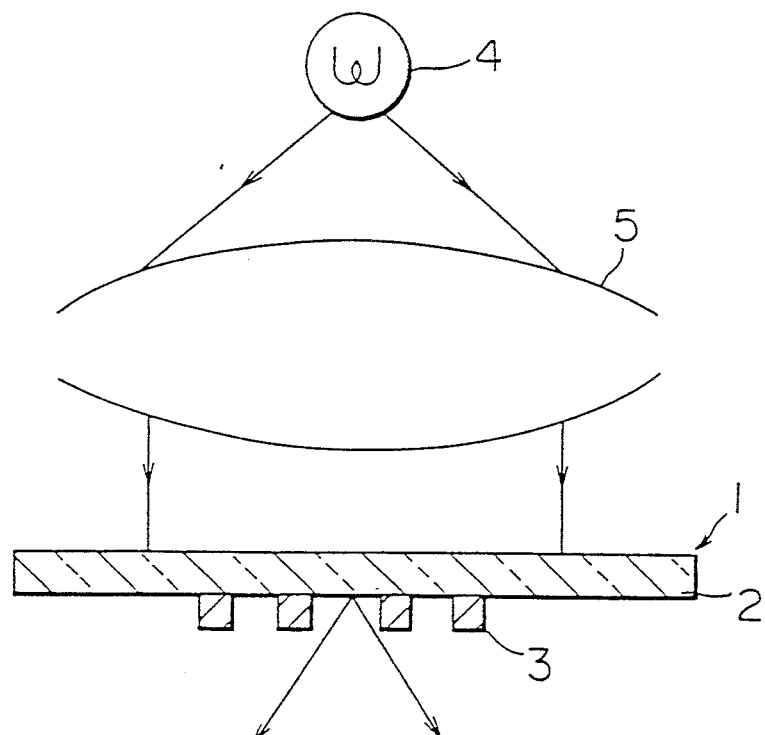
FIG. 6 is a diagram showing how pattern transfer is conducted using the photomask of FIG. 5.
Figure 6:
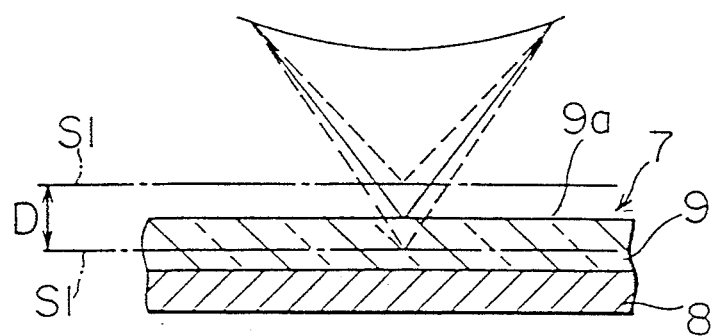

FIG. 4 is a sectional view showing, as an example of a wafer having a surface level difference, a memory IC as it is being produced. Formed on a silicon monocrystal substrate 41 are a memory cell section 42 and a peripheral circuit section 43. The memory cell section 42 is composed of a gate 44, a bit line 45, a storage node 46, etc. The peripheral circuit section 43 is composed of a gate 47, a bit line 48, a cell plate 49, etc. Formed on the substrate 41, with the memory cell portion 42 and the peripheral circuit portion 43 is an insulating film 50, on which a photoresist 51 is formed. As can be seen from FIG. 4, the memory cell section 42 is thicker than the peripheral circuit section 43 due to the presence of the storage node 46, with the result that the photoresist 51 has a surface level difference B between the memory cell section 42 and the peripheral circuit section 43.

By using a photomask according to the present invention as shown in FIG. 1, it is possible to form optimum image formation planes of the patterns of the photomask simultaneously on first and second regions R3 and R4 having different heights due to the difference in surface level B. FIG. 4 shows how contact-hole patterns 52 and 53 are respectively transferred with high accuracy onto the first and second regions R3 and R4 of the photoresist 51.

When, as in the case of FIG. 4, the patterns 52 and 53, transferred onto the first and second regions R3 and R4 of the wafer, are independent of each other, the light projected onto the first region R3 and the light projected onto the second region R4 do not interfere with each other, so that there is no need to set the phase difference between these light rays to zero.

While the above embodiment has been described with reference to the case where the wafer has two regions with different surface levels, this invention also makes it possible for high-accuracy pattern transfer to be effected in the same manner onto a wafer having three or more regions whose surface levels differ from each other.

What is claimed is:

1. A photomask for projecting a transfer pattern onto a wafer having first and second regions with different surface level positions, said photomask comprising:
   a transparent substrate;
   first and second mask patterns, each mask pattern including a plurality of light shielding members disposed on said transparent substrate for projection of the first and second mask patterns onto separate first and second regions of a wafer, respectively, the first region being disposed at a first level of the wafer and the second region being disposed at a second level of the wafer different from the first level; and
   an optical-path-length varying layer covering the second mask pattern, but not the first mask pattern, for changing the optical path length of light transmitted through the second mask pattern with respect to the optical path length of light transmitted through the first mask pattern by a length corresponding to the difference between the second level and the first level of the wafer.

2. The photomask according to claim 1 wherein said first and second regions are contiguous and said optical-path-length varying layer reduces the phase difference between light transmitted respectively through the first and second mask patterns to zero.

3. The photomask according to claim 1 wherein said optical-path-length varying layer is one of the following materials: an oxide, a nitride, and an organic-type polymer.

4. A method of transferring a pattern onto a wafer having first and second regions with different surface level positions comprising:

illuminating a photomask having first and second mask patterns to project the first and second mask patterns onto corresponding first and second regions of a wafer, respectively, the first region being disposed at a first level of the wafer and the second region being disposed at a second level of the wafer different from the first level;

changing the optical path length of light transmitted through the first mask pattern but not the second mask pattern by a length corresponding to the difference between the second level and the first level of the wafer, thereby effecting a change in the position of the apparent object-side image surface for the first and second patterns of said photomask; and projecting an image of each of the first and second patterns onto the first and second regions of the wafer, respectively, with light transmitted through the first and second mask patterns of said photomask.

5. The method according to claim 4 wherein the difference in phase between the light transmitted through the first and second mask patterns is zero.

* * * * *